United States Patent [19]

Naoi et al.

[11] 3,987,680
[45] Oct. 26, 1976

[54] UHF TUNER DEVICE

[75] Inventors: Mitsuaki Naoi, Tokyo; Chozo Kishida, Atsugi; Kenichi Shiotsuki, Zama, all of Japan

[73] Assignee: Mitsumi Electric Co., Ltd., Chofu, Japan

[22] Filed: Aug. 26, 1974

[21] Appl. No.: 500,656

[30] Foreign Application Priority Data

| Aug. 27, 1973 | Japan | 48-95939 |
| Nov. 9, 1973 | Japan | 48-125433 |
| Dec. 26, 1973 | Japan | 49-144035 |
| Dec. 26, 1973 | Japan | 49-144036 |
| Dec. 26, 1973 | Japan | 49-144037 |
| Dec. 29, 1973 | Japan | 49-149 |
| Dec. 27, 1973 | Japan | 49-4218 |
| Dec. 28, 1973 | Japan | 49-2752[U] |
| Dec. 28, 1973 | Japan | 49-2751[U] |
| Dec. 27, 1973 | Japan | 49-4718[U] |
| Dec. 29, 1973 | Japan | 49-147[U] |

[52] U.S. Cl. .............. 74/10.54; 74/10.6; 74/10.41
[51] Int. Cl.² ................................. F16H 35/18
[58] Field of Search ............. 74/10.54, 10.41, 10.45, 74/10.6, 10 R, 10.15

[56] References Cited
UNITED STATES PATENTS

| 1,912,757 | 6/1933 | Brump | 74/10.6 |
| 3,529,478 | 9/1970 | Hayakawa | 74/10.54 |
| 3,618,406 | 11/1971 | Mohrickl | 74/10.8 |
| 6,618,405 | 11/1971 | Ishida | 74/10.54 |

*Primary Examiner*—Samuel Scott
*Assistant Examiner*—Randall Heald
*Attorney, Agent, or Firm*—Haseltine, Lake & Waters

[57] ABSTRACT

A UHF Tuner device having a first rotating member rotating unitarily with a coarse tuning rotating shaft and adapted to be indexed and held in a position to which it has been thus rotated; a second rotating member rotated unitarily with a fine tuning rotating shaft; and a third rotating member rotated by the rotation of the second rotating member thereby to vary the capacitance of a variable capacitor of a tuner device proper, the second and third rotating member rotating unitarily with the first rotating member at the time of channel-selection coarse tuning when the coarse turning rotating shaft is rotated, and the third rotating member being rotated in accordance with the rotation of the second rotating member at the time of fine tuning when the fine tuning rotating shaft is rotated. The first rotating member has slots formed therein in radial directions thereof, while the second and third rotating members respectively have cam grooves formed with certain angular ranges with respect to their respective centers, the rotation of the second rotating member being transmitted to the third rotating member by engagement members inserted through the slots of the first rotating member and clamped between the cam grooves of the second and third rotating members.

14 Claims, 16 Drawing Figures

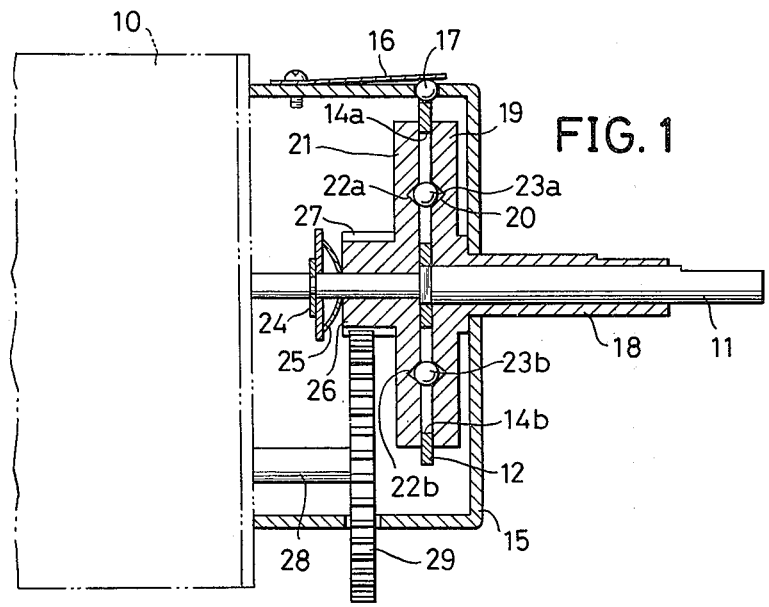
FIG. 1
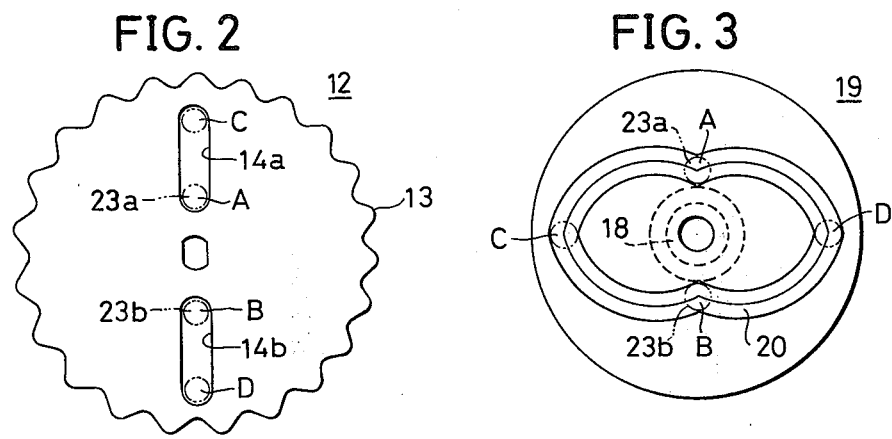
FIG. 2
FIG. 3
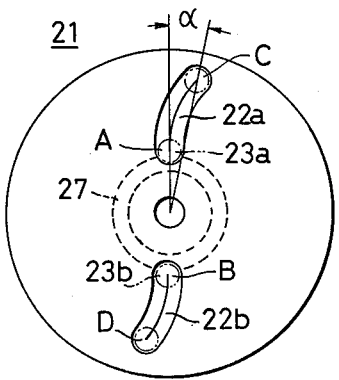
FIG. 4

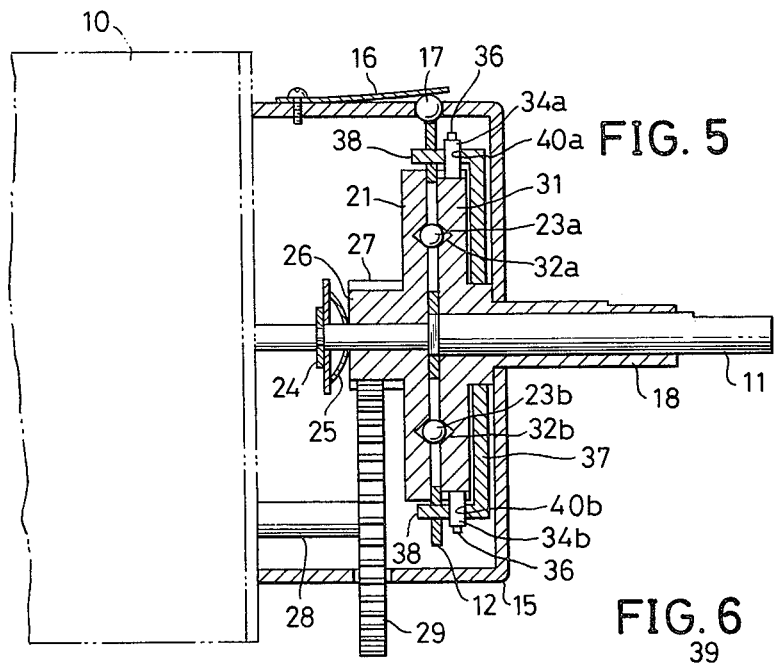
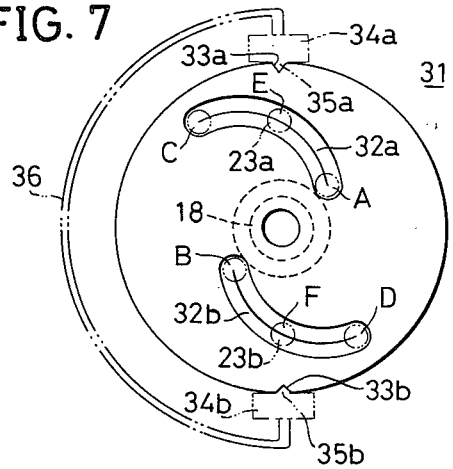
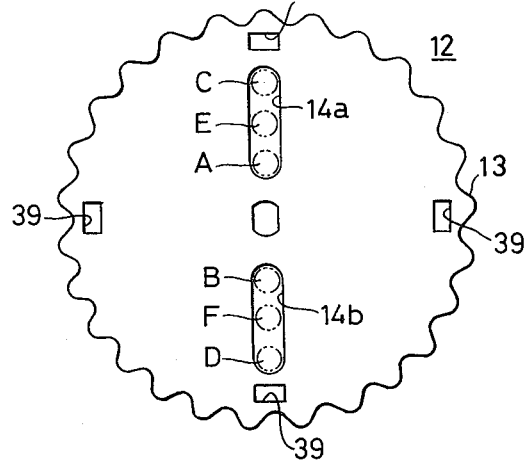
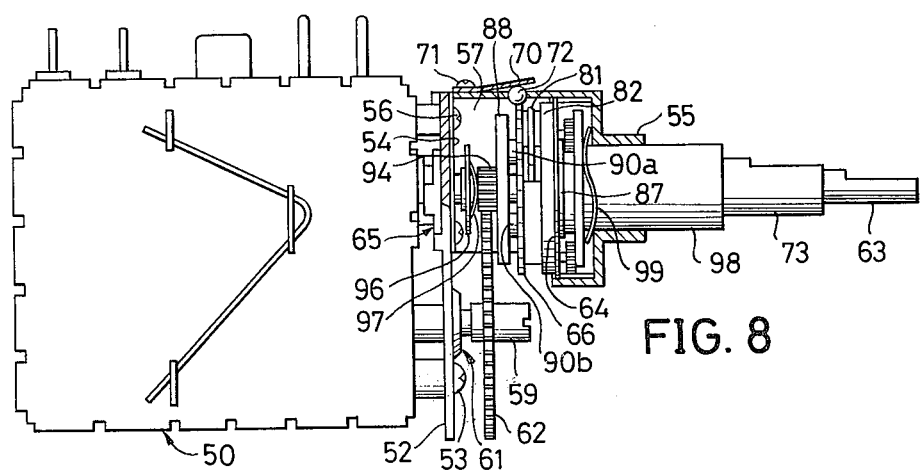

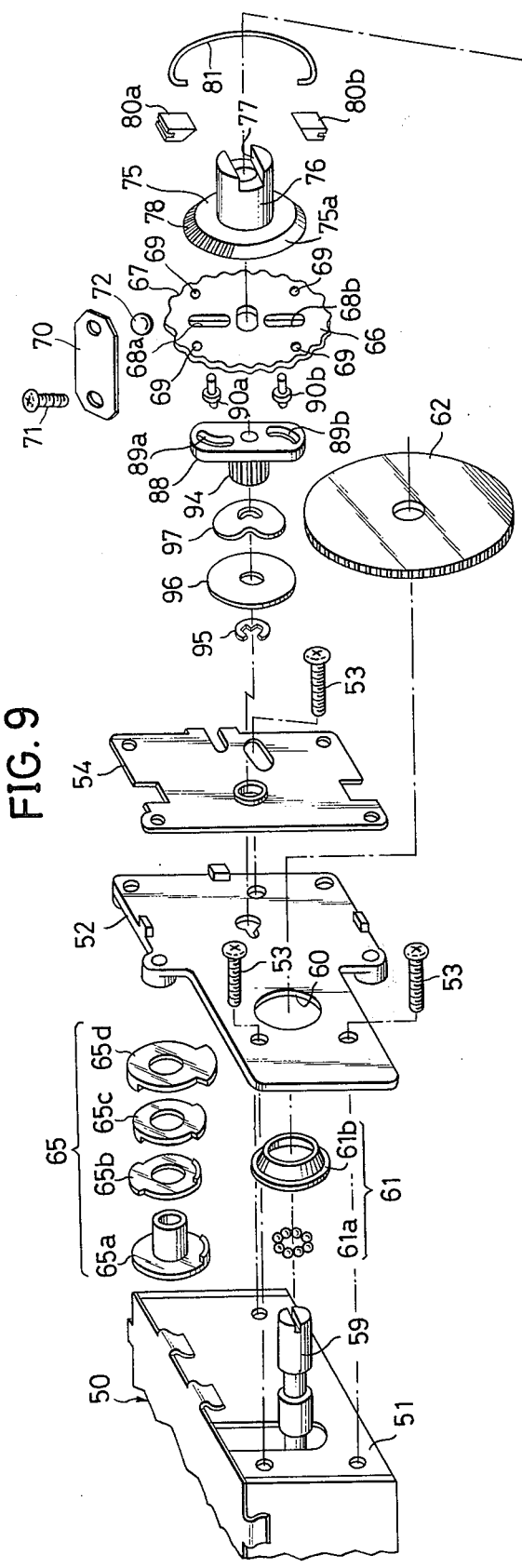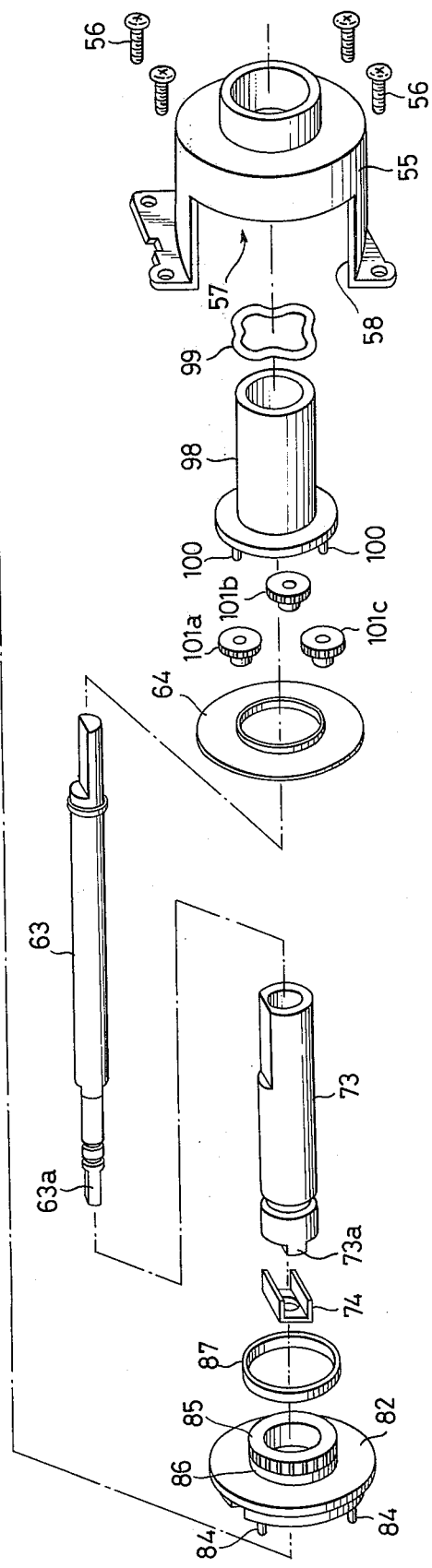
FIG. 9

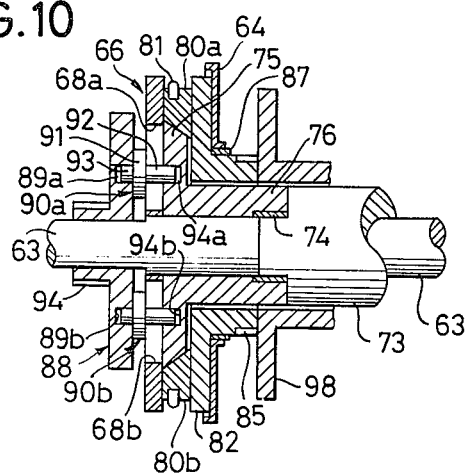
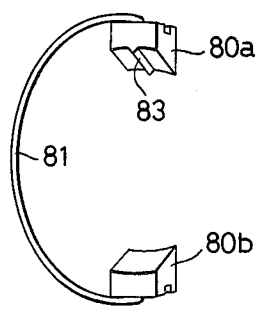
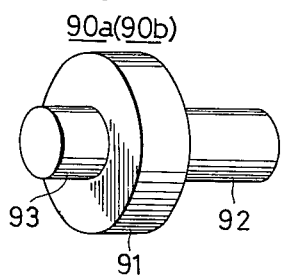
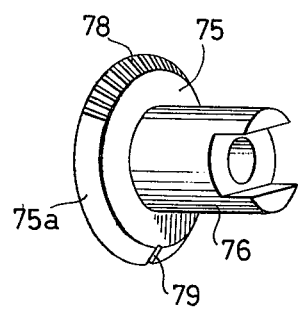
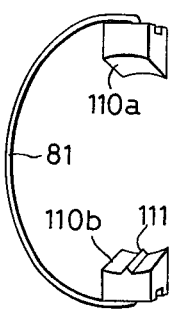
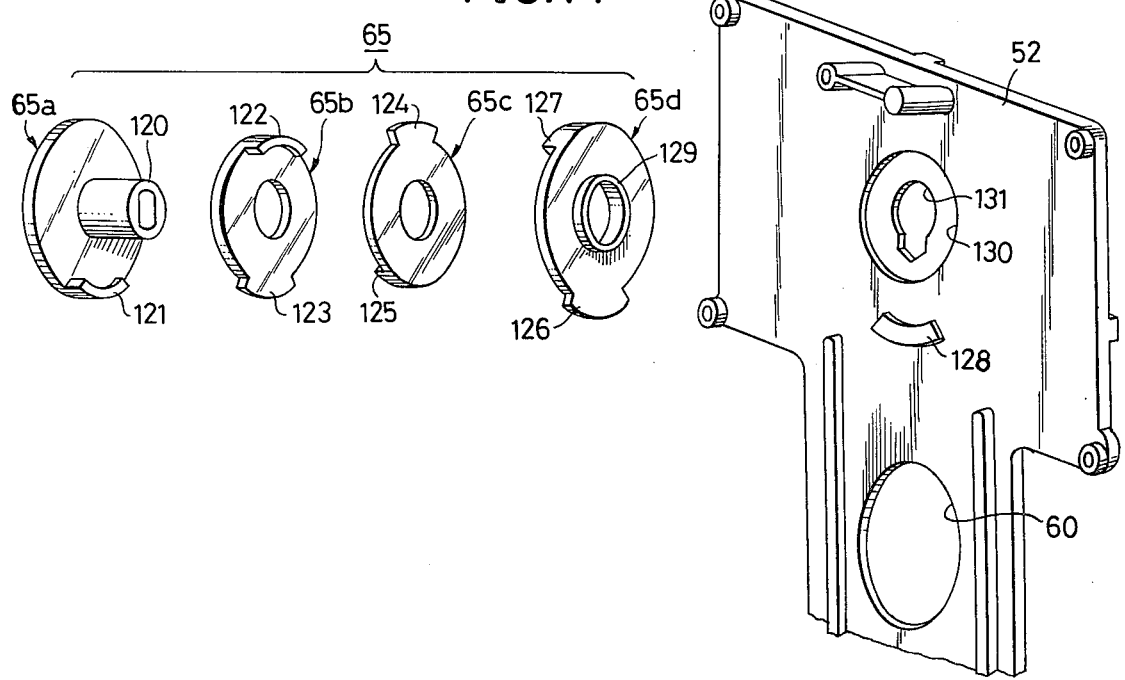

UHF TUNER DEVICE

BACKGROUND OF THE INVENTION

The present invention relates generally to a UHF tuner device, and more particularly to a UHF tuner device in which the capacitance value of a variable capacitor of the tuner device proper is varied to a value corresponding to approximately a desired channel by the tuning of a coarse tuning shaft for channel selection and then varied finely by the rotation of a fine tuning shaft.

In general, in a UHF tuner device of this kind, it is necessary to cause the rotor shaft of the variable capacitor to undergo minute angular rotation then the rotational angle of the fine tuning shaft in order to vary and tune finely and accurately the capacitance of the variable capacitor as a result of the rotation of the fine tuning shaft.

For this purpose, it has been a practice heretofore to use a speed reducing gear mechanism to cause the above mentioned rotor shaft to undergo a minute rotational angle relative to the rotational angle of the fine tuning shaft. However, in order to obtain a desirable speed reduction ratio, a large gear mechanism becomes necessary, and the tuner device also becomes large in size. Conversely, when an attempt is made to miniaturize the tuner device, a desirable speed reduction ratio cannot be obtained, and accurate fine adjustment cannot be attained. Furthermore, conventional UHF tuner devices have been accompanied by the problems of complicated organization, large number of component parts, and high production cost.

SUMMARY OF THE INVENTION

Accordingly, it is a general object of the present invention to provide a novel and useful UHF tuner device in which the above described difficulties accompanying the prior art have been overcome.

A specific object of the invention is to provide a UHF tuner device whereby fine tuning can be accomplished accurately with a simple mechanism.

Another object of the invention is to provide a UHF tuner device which has a variable capacitor, and in which is used, as means for transmitting rotation of a fine tuning shaft to the rotor shaft of the variable capacitor, a mechanism comprising: a first rotating member rotating unitarily with a coarse tuning shaft and provided with slots in the radial direction thereof; a second rotating member pressed against one side of the firsst rotating member and rotating unitarily with a fine tuning shaft; a third rotating member pressed against the other side of the first rotating member and adapted to rotate the rotor shaft; and second and third rotating members having cam grooves formed in their mutually facing surfaces; and engagement members clamped between the cam grooves of the second and third rotating members and inserted through the slots of the first rotating member. By appropriately selecting the shapes of the cam grooves, particulars of the mechanism such as the range of rotation of the fine tuning shaft and the speed-reduction ratio in the transmission of rotation from the second rotating member to the third rotating member can be set as desired.

Still another object of the invention is to provide a UHF tuner device in which the position of the rotational midpoint position of the fine tuning shaft can be readily determined.

A further object of the invention is to provide a UHF tuner device in which the fine tuning shaft on which is mounted a relatively heavy member, such as a knob, is prevented from rotating further because of momentum when the coarse tuning shaft, which has been rotating, is stopped.

Other objects and further features of this invention will be apparent from the following detailed description with respect to preferred embodiments of the invention when read in conjunction with the accompanying drawings.

BRIEF DESCRIPTION OF THE DRAWINGS

In the drawings:

FIG. 1 is a side view, in longitudinal section, showing the essential parts of a first embodiment of the UHF tuner device according to the invention;

FIG. 2 is a front view of a detent plate for setting rotational positions for coarse tuning of the device illustrated in FIG. 1;

FIG. 3 is a rear view of a plate part for fine tuning driving of the same device;

FIG. 4 is a front view of a driven plate for fine tuning of the same device;

FIG. 5 is a side view, in longitudinal section, showing the essential parts of a second embodiment of the UHF tuner device according to the invention;

FIG. 6 is a front view of a plate for setting rotational positions for coarse tuning of the device illustrated in FIG. 5;

FIG. 7 is a rear view of a plate part for fine tuning driving of the same device;

FIG. 8 is a side view, partly in longitudinal section, showing a third embodiment of the UHF tuner device according to the invention;

FIG. 9 is an exploded perspective view showing the component parts of the device illustrated in FIG. 8;

FIG. 10 is an enlarged side view, in longitudinal section, showing one part of the device illustrated in FIG. 8;

FIG. 11 is a perspective view of a pair of pressing members of the same device;

FIG. 12 is an enlarged perspective view of a roller of the same device;

FIG. 13A and 13B are perspective views respectively showing other embodiments of a fine tuning driving member and a pressing member;

FIG. 14 is an enlarged, exploded perspective view of a stop mechanism; and

DETAILED DESCRIPTION

Figure 15:
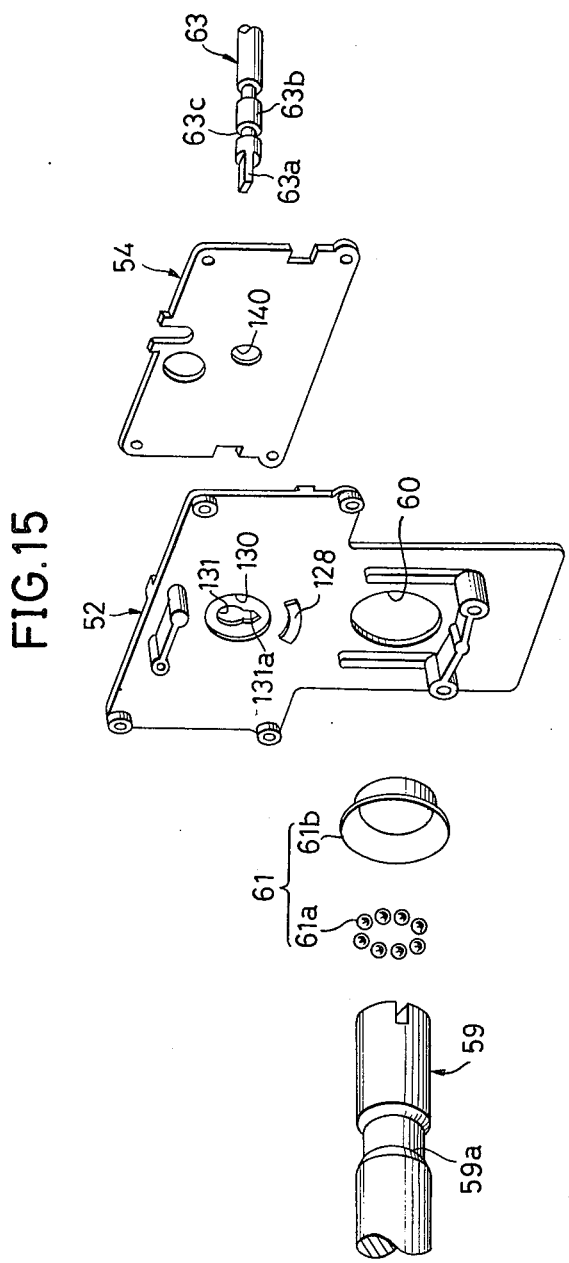
FIG. 15 is an enlarged, exploded perspective view showing bearing mechanisms for a rotor shaft and a coarse tuning shaft.

Referring first to FIGS. 1 through 4, a first embodiment of the UHF tuner device according to the present invention will be described.

A coarse tuning shaft 11 for channel selection is journaled by bearings in a tuner device proper 10 and is adapted to accomplish selection upon being turned. A detent plate 12 for setting coarse tuning rotational position is fitted onto the shaft 11 in a manner to rotate unitarily therewith.

The detent plate 12 has a generally circular planar shape as shown in FIG. 2, wherein gently undulating concave and convex cogs or parts 13 are formed continuously around the entire outer periphery of the plate. Furthermore, the detent plate 12 is provided with slots 14a and 14b alined in a diametric direction on opposite sides of the center of the plate. A ball 17 is continually pressed by a leaf spring 16 provided on a case 15 against the undulating outer periphery of the detent plate 12. As a result of this provision, the detent plate 12, upon being turned, is set or indexed intermittently in rotational positions determined by the engagement of the ball 17 with concave depressions in the undulating periphery 13 of the plate 12.

A fine tuning shaft 18 of tubular form is fitted concentrically on the coarse tuning shaft 11 and is free to rotate independently thereof. This fine tuning shaft 18 is rotatably journaled by the case 15 and extends outward (to the right as viewed in FIG. 1) therefrom. A fine tuning driving disk 19 formed integrally and coaxially with the fine tuning shaft 18 is housed within the case 15 and is contacting the outer face of the detent plate 12. This fine tuning driving disk 19 is provided with a continuous curved cam groove 20 as shown in FIG. 3 formed in its inner face.

A fine tuning driven disk 21 is fitted rotatably and coaxially on the coarse tuning shaft 11 and is in contact with the other, inner face of the detent plate 12. In the outer face of the fine tuning driven disk 21, i.e., the face thereof in contact with the detent plate 12, there are formed a pair of curved cam grooves 22a and 22b each extending from a position near the center of the disk 21 to a position near its periphery as shown in FIG. 4. A pair of balls 23a and 23b are clamped between and held in the cam groove 20 of the above described fine tuning driving disk 19 and the cam grooves 22a and 22b of the fine tuning driven disk 21 and are insertedly disposed within the slots 14a and 14b of the detent plate 12.

Furthermore, the fine tuning driven disk 21 has on its inner side a boss part 26, which is pressed outward, or toward the detent plate 12, by the force of a leaf spring 25 interposed between the inner face of the boss part 26 and a circular clip or E-shaped washer 24 fixed to the coarse tuning shaft 11. Gear teeth 27 are formed around the peripheral surface of the boss part 26 of the fine tuning driven disk 21. This gear 27 is meshed with a gear 29 fixed to the rotor shaft 28 of a variable capacitor (not shown) of the UHF tuner.

The distances from the centers to the points nearest these centers respectively of the slots 14a and 14b of the detent plate 12, the cam groove 20 of the fine tuning driving disk 19, and the cam grooves 22a and 22b of the fine tuning driven disk 21 are substantially equal, and the distances from these centers to the points most remote from these centers respectively of these slots and cam grooves are also substantially equal.

The device of the above described construction according to the invention operates as follows. When selection for reception of UHF broadcasting channels is to be carried out, the coarse tuning shaft 11 is first turned by a knob (not shown). Since the undulating periphery 13 of the detent plate 12 rotating unitarily with the coarse tuning shaft 11 at this time is being pressed by the ball 17, the detent plate 12 is subjected to a light arresting force every time the ball 17 descends into a concave depression in the undulating periphery, and for this reason, the coarse tuning shaft 11 rotates intermittently.

As mentioned briefly hereinabove, the fine tuning driven disk 21 is being pressed outward or toward the detent plate 12 and fine tuning driving disk 19 by the leaf spring 25, and the disk 19 at its boss part is abutting against the case 15 and is thus limited in outward displacement. Consequently, the fine tuning driving disk 19, the detent plate 12, and the fine tuning driven disk 21 are mutually in frictional contact. Therefore, when the coarse tuning shaft 11 is turned, the detent plate 12 rotating unitarily therewith, together with the fine tuning driving disk 19, as well as the fine tuning driven disk 21 rotate unitarily without changing their mutual relationship of rotational position. As a result of the rotation of the fine tuning driven disk 21, the gear 29 and the rotor shaft 28 rotate, and the capacitance of the variable capacitor of the UHF tuner is varied. Thus, coarse tuning selection of the desired broadcasting channel to be received is achieved.

Then, in order to attain fine tuning of the channel to be received and selected by coarse tuning in this manner, the fine tuning shaft 18 is turned. As a result of the turning of the fine tuning shaft 18, the fine tuning driving disk 19 also rotates unitarily therewith. At this time, together with the rotation of the fine tuning driving disk 19, the detent plate 12 is subjected to a torque because of frictional force between it and the fine tuning driving disk 19, but because of the arresting force of the ball 17 imparted to the undulating peripheral edge 13 of the detent plate 12, the detent plate 12 is retained in original rotational position.

On one hand, balls 23a and 23b are interposed between the cam groove 20 of the fine tuning driving disk 19 and the cam grooves 22a and 22b of the fine tuning driven disk 21 and lie insertedly in the slots 14a and 14b of the detent plate 12, which is not moving. These balls 23a and 23b are limited in movement by the slots 14a and 14b of the detent plate 12 to only translational displacement in a diametric direction, in which they can move only to approach or move away from the center of the detent plate 12, being prevented from undergoing rotational displacement in the circumferential direction of the detent plate 12. For this reason, when the fine tuning driving disk 19 is rotated, the displacement positions of the balls 23a and 23b in the slots 14a and 14b relative to the rotational angle of the fine tuning driving disk 19 are determined by the shape of the cam groove 20.

When these balls 23a and 23b undergo displacement within their respective slots 14a 14b, the fine tuning driven disk 21 is turned by a minute angle in accordance with the shape of its cam grooves 22a and 22b. As a consequence, the rotor shaft 28 is also rotated through a very small angle, and fine tuning with respect to the broadcasing channel selected by coarse tuning in the aforedescribed manner is accomplished.

Then, if the balls 23a and 23b are respectively at the positions indicated at A and B in the slots 14a and 14b, the cam groove 20, and the cam grooves 22a and 22b, for example, these balls 23a and 23b will relatively reach the positions indicated at C and D within the cam groove 20 when the fine tuning driving disk 19 is rotated through 90° in the clockwise direction in FIG. 3, for example, at the same time reaching the positions as indicated at C and D within the slots 14a and 14b and the cam grooves 22a and 22b. Accordingly, as a result of a 90° rotation of the fine tuning driving disk 19, the fine tuning driven disk 21 rotates only through a minute angle $\alpha$ (<90°) in the counterclockwise direction.

Then, when the fine tuning driving disk 19 is further turned 90° in the clockwise direction or is turned 90° in the counterclockwise direction, the balls 23a and 23b return from the position C in FIGS. 2 and 4 to the position A, and the fine tuning driven disk 21 rotates clockwise through the angle α. Therefore, by rotating the fine tuning driving disk 19 through a desired angle within 90°, the fine tuning driven disk 21 can be rotated within the angle α, which is less than this desired angle, and fine tuning can thus be accomplished.

By appropriate selection of the shapes of the above described cam grooves 20, 22a, and 22b, the relationship of the rotational angle of the fine tuning driven disk 21 to the rotational angle of the fine tuning driving disk 19 can be selected as desired.

A second embodiment of the tuner device according to the present invention will now be described with reference to FIGS. 5, 6, and 7, in which parts which are the same as corresponding parts in FIGS. 1 through 4 are designated by like reference numerals and characters. Detailed description of such parts will not be repeated.

A fine tuning driving disk 31 formed integrally with the fine tuning shaft 18 is provided in its inner face with a pair of curved cam grooves 32a and 32b each formed to extend obliquely from a position near the center of the disk toward a position near the outer peripheral edge of the disk as shown in FIG. 7. A pair of notches 33a and 33b are formed in the outer periphery of the fine tuning driving disk 31 at diametrically opposite points thereof. A pair of engaging members 34a and 34b are continually biased by a spring 36 to press against the outer periphery of the fine tuning driving disk 31, and in the state indicated in FIG. 7, protrusions 35a and 35b are engaged with the notches 33a and 33b.

A holding plate 37 is rotatably fitted on a boss part of the fine tuning driving disk 31 on the outerside thereof and has four inwardly bent lugs 38, which are respectively fitted into four holes 39 formed in the detent plate 12 for setting coarse tuning rotational positions, whereby the holding plate 37 can rotate unitarily with the detent plate 12. Two diametrically opposite bent lugs 38 of this holding plate 37 are provided respectively with holes 40a and 40b, in which the above mentioned engaging members 34a and 34b are securely fitted and thus held.

The positional relationships of parts such as the above described notches 33a and 33b of the fine tuning driving disk 31, the engaging members 34a and 34b, and the cam grooves 32a and 32b are so set that the protrusions 35a and 35b of the detent members 34a and 34b engage with the notches 33a and 33b when the balls 23a and 23b are in the midpoint positions of the cam grooves 32a and 32b.

When the coarse tuning shaft 11 is turned during selection of a UHF channel to be received, the detent plate 12, the fine tuning driving disk 31, the fine tuning driven disk 27, the holding plate 37, the engaging members 34a and 34b, and related parts also rotate intermittently unitarily with the shaft 11. The rotation of the fine tuning driven disk 27 causes the rotor shaft 28 to rotate, and coarse tuning for selection of the desired broadcasting channel is achieved, similarly as in the preceding first embodiment.

For fine tuning of the channel to be received selected by coarse tuning in this manner, the fine tuning shaft 18 is turned, whereupon the fine tuning driven disk 31 also rotates unitarily therewith. Since the detent plate 12 is being detained by the ball 17, the balls 23a and 23b undergo displacement in radial directions of the detent plate 12 in and along the slots 14a and 14b in accordance with the rotational angle of the fine tuning driving disk 31 and the shapes of the cam grooves 32a and 32b as the fine tuning driving disk 31 rotates. As a result of this displacement of the balls 23a and 23b, the fine tuning driven disk 21 is also rotated in accordance with the shapes of the cam grooves 22a and 22b shown in FIG. 4, and the rotor shaft 28 is turned through a minute angle, whereby fine tuning is achieved.

Then, when the fine tuning driving disk 31 is positioned at the midpoint of its rotational range (i.e., the range in which the fine tuning driving disk 31 can rotate so that the balls 23a and 23b are relatively positioned between the positions A, B and positions C, D in FIG. 7), that is, when the balls 23a and 23b are positioned at positions E and F in the cam grooves 32a and 32b, the notches 33a and 33b formed on the outer periphery of the fine tuning driving disk 31 arrive at the positions respectively of the protrusions 35a and 35b of the engaging members 34a and 34b, whereupon the protrusions 35a and 35b enter into and become engaged with the notches 33a and 33b.

Since the fine tuning driving disk 31 is thereby subjected to a light arresting force due to the protrusions 35a and 35b, it is possible to detect the fact that, during the rotation of the fine tuning shaft 18, it has reached the midpoint position of its rotational range during the turning manipulation thereof. Therefore, by taking that midpoint position as a datum reference point and rotating the fine tuning shaft 18 in one or the opposite direction with respect thereto, fine tuning operation can be easily accomplished.

When, after the protrusion 35a and 35b have engaged with the notches 33a and 33b, the fine tuning shaft 18 is turned further, these protrusions 35a and 35b are readily dislodged and separated from the notches 33a and 33b, and the rotation of the fine tuning driving disk 31 is not obstructed.

A third embodiment of the tuner device according to the present invention will now be described with reference to FIGS. 8 through 15. FIG. 8 is a side view, with parts cut away and parts in longitudinal section, showing the third embodiment of the tuner device of the invention in assembled state, while FIG. 9 is an exploded perspective view of the essential component parts of the device.

In this embodiment, a first bearing plate 52 is fixed by screws 53 to a case 51 of a tuner device proper 50. An auxiliary bearing plate 54 and a housing 55 are fixed to the bearing plate 52 with screws 56. Between the auxiliary bearing plate 54 and the housing 55, a hollow space or chamber 57 is formed. The housing 55 has a cutout opening 58. The tuner device proper 50 has therewithin a variable capacitor (not shown) for channel selection, which has a rotor shaft 59 extending through and out of the case 51. This rotor shaft 59 is journaled by the case 51 and a ball bearing 61 comprising steel balls 61a and a ring 61b and fitted into a hole 60 formed in the bearing plate 52. A gear 62 is fixedly supported on the outer end of this rotor shaft 59.

A coarse tuning shaft 63 is journaled by the first bearing plate 52, the auxiliary bearing plate 54, and a second bearing plate 64 fixed by press fitting to the housing 55 within its space 57. Around the inner end part 63a of the coarse tuning shaft 63, which is passed through the bearing plate 52, a stop mechanism 65 comprising four rotating elements 65a through 65d is provided in clamped state between the case 51 and the bearing plate 52.

A detent plate 66 for setting coarse tuning rotational position is fitted onto the coarse tuning shaft 63 at a specific position thereof and is thereby rotatable unitarily therewith. The detent plate 66 has an outer peripheral edge of smoothly continuous undulations 67 comprising alternate concave hollows and convex ridges and has slots 68a and 68b of specific dimensions formed in a diametric direction and respectively on opposite sides of the center of the plate. A ball 72 is pressed against the undulating edge 67 of the detent plate 66 by a leaf spring 70 fixed to the housing 55 by a screw 71.

A fine tuning shaft 73 fitted rotatably and coaxially around the coarse tuning shaft 63 and is rotatable independently thereof. The inner end 73a of fine tuning shaft 73 is coupled to a fine tuning driving disk 75 by being fitted into a cutout recess 77 in the outer end of a cylindrical boss 76 projecting outward from the center of the fine tuning driving disk 75, on elastic member 74 of channel shape made of a material such as urethane rubber and having a suitable resilience being interposed between the inner end 73a and the outer end of the boss 76. The fine tuning driving disk 75 is thus rotated unitarily by the fine tuning shaft 73.

The fine tuning driving disk 75 is rotatably fitted on the coarse tuning shaft 63 to rotate independently thereof. This fine tuning driving disk 75 has a frustoconical shape with a beveled edge surface 75a provided with serrations 78 comprising small grooves and ridges running in the elemental direction of the conical surface and covering approximately half the surface in its circumferential direction. The spacing between the small grooves of these serrations 78 corresponds to the frequency interval of 100 KHz, for example, at the time of fine tuning. Cam grooves of shapes and positions as shown in FIGS. 3 or 7, for example, are formed in the inner face of the fine tuning driving disk 75.

For cooperative operation with the serrated surface 75a of the fine tuning driving disk 75, there are provided a pair of pressing members 80a and 80b fitted in a pair of cutout recesses in a holding plate 82. These pressing members 80a and 80b continually press against the bevelled surface 75a of the fine tuning driving disk 75, being urged toward the surface 75a by a spring 81 of approximately semicircular shape held by the holding plate 82. For this reason, the fine tuning driving disk 75 is subjected to a force in the direction to press against the outer face of the detent plate 66 along the central axial direction as a result of the pressing, clamping force of the pressing members 80a and 80b. As shown in FIG. 11, the pressing members 80a and 80b have respective inclined surfaces for conformingly contacting the conical surface 75a of the fine tuning driving disk 75, and, moreover, the pressing member 80a is provided at the central part of its inclined surface with a ridge 83 for engagement with the aforementioned serrations 78 of the conical surface 75a.

A holding plate 82 is loosely fitted on the cylindrical boss 76 of the fine tuning driving disk 75 and, moreover, has four pins 84 fixed to and projecting from its inner face and fitted into four holes 69 formed in the detent plate 66, whereby the holding plate 82 rotates unitarily with the detent plate 66. Furthermore, the holding plate 82 has a cylindrical boss 86 having a gear 85 formed at the outer end thereof and is rotatably fitted at its boss 86 to the second bearing plate 64 by way of an elastic ring 87 interposed therebetween.

A fine tuning driven member 88 is rotatably fitted on the coarse tuning shaft 63 and is contacting the inner face of the detent plate 66. Cam grooves 89a and 89b of shapes and positions similar to those shown in FIG. 4 are formed in the outer face of this fine tuning driven member 88. Between these cam grooves 89a and 89b of the fine tuning driven member 88 and the cam grooves of the fine tuning driving disk 75, there are clamped a pair of rollers 90a and 90b inserted through the slots 68a and 68b of the detent plate 66. These rollers 90a and 90b are of identical shape as shown in FIG. 12, comprising a cylindrical flange part 91 and two cylindrical parts 92 and 93 of small diameter extending coaxially from opposite faces of the flange part 91. As shown in FIG. 10, the cylindrical part 92 of each roller 90a (90b) is passed through a slot 68a (68b) and is fitted in a cam groove 94a (94b) of the fine tuning driving disk 75, while the cylindrical part 93 is fitted in a cam groove 89a (89b) of the fine tuning driven member 88. The cylindrical flange part 91 is clamped between the detent plate 66 and the fine tuning driven member 88. The fine tuning driven member 88 has, integrally formed therewith, a gear 94 for meshing with the aforementioned gear 62.

The fine tuning driven member 88 is pressed at the inner end of its gear 94 by a resilient wave washer 97 interposed between the gear 94 and an E washer 95 and a washer 96 and thereby presses against the detent plate 66 by way of the cylindrical flanges 91 of the rollers 90a and 90b.

An indicator rotating member 98 of tubular shape is rotatably fitted on the fine tuning shaft 73 and journaled by the housing 55 and extends outward through the outer end of this housing. A resilient wave washer 99 is interposed between the housing 55 and the rotating member 98, which is thereby urged inward. This rotating member 98 has on its inner end a flange fixedly supporting three pins 100 which project inward and rotatably support epicyclic gears 101a, 101b, and 101c. These gears 101a, 101b, and 101c are meshed with the gear 85 formed on the boss 86 of the holding plate 82 and an internal gear (not shown) provided on an inner wall surface of the housing 55.

In this connection, it might be mentioned that, at the time of assembly, the indicator rotating member 98 and related parts are first assembled within the housing 55, and thereafter the bearing plate 64 is pushed into the housing 55 as the rotating member 98 and related parts are pressed thereby counter to the force of the wave washer 99, the bearing plate 64 then being fixed in its pushed in position. The rotating member 98 and related parts are thus held between the housing 55 and the bearing plate 64 and prevented from being dislodged.

For selectively changing the UHF broadcasting channel in the UHF tuner device of the above described construction, the coarse tuning shaft 63 is turned. As a result of this turning of the coarse tuning shaft 63, the detent plate 66 and the fine tuning driving disk 75 and the fine tuning driven member 88 pressed thereagainst by the pressing force of the pressing members 80a and 80b and the wave washer 97 rotate unitarily. At the same time, as a result of the arresting action of the ball 72 pressing against the undulating peripheral edge of the detent plate 66, the coarse tuning shaft 63, the detent plate 66, the fine tuning driving disk 75, and the fine tuning driven member 88 rotate intermittently for each channel or for each group of a plurality of channels.

Furthermore, since the rollers 90a and 90b are pressed and clamped at their flanges 91 by the detent plate 66 and the fine tuning driven member 88, they undergo no displacement. Accordingly, the fine tuning driving disk 75, the detent plate 66, and the fine tuning driven member rotate unitarily without any deviation in their relationships of mutual relative position through the rollers 90a and 90b. Furthermore, together with the rotation of the detent plate 66, the holding plate 82 and the pressing members 80a and 80b and the spring 81 held thereby rotate unitarily.

With the rotation of the fine tuning driven member 88, the gear 94 rotates unitarily, and the gear 62 meshed therewith also rotates thereby to rotate the rotor shaft 59. As a result, the capacitance of the variable capacitor is varied, and coarse tuning to the desired channel is accomplished.

Furthermore, the above mentioned rotation of the holding plate 82 is transmitted by way of the gears 101a, 101b, and 101c meshed with its gear 85 to rotate the indicator rotating member 98, whereupon the numeral of the above mentioned desired channel is indicated by an indicator (not shown).

The rotation of the fine tuning driving disk 75 in the above described coarse tuning causes the fine tuning shaft 73 to rotate also. Then, if a knob (not shown) of a relatively heavy weight is attached to the fine tuning shaft 73, the fine tuning shaft 73 will tend to rotate further as a result of the rotational momentum of the knob when the rotation of the coarse tuning shaft 63 is stopped. However, the inertial torque of the fine tuning shaft 73 is absorbed by the elastic deformation of the elastic member 74 and is not transmitted to the fine tuning driving disk 75. Therefore, displacement due to inertial torque of the fine tuning shaft 73 of the fine tuning driving disk 75 relative to the detent plate 66 and the fine tuning driven member 88 is positively prevented.

Furthermore, since the ridge 83 of the pressing member 80a is pressed against and engaged with the serrations of the fine tuning driving disk 75, this driving disk 75 is set by the pressing members 80a and 80b in position relative thereto. For this reason, also, the fine tuning driving disk 75 is prevented from undergoing relative displacement due to the effect of inertial torque of the control knob and other bodies.

Then, for fine tuning with respect to the channel selected by coarse tuning in the above described manner, the fine tuning shaft 73 is turned. Since the detent plate 66 is arrested by the ball 72 and thereby set in its rotational position, the fine tuning driven member 88 operates in a manner which can be readily understood from the foregoing description of the preceding first and second embodiments. That is, when the fine tuning rotating disk 75 is rotated as a result of the turning of the fine tuning shaft 73, the fine tuning driven member 88 rotates within an angle range with respect to the centers of rotation between the two ends of the cam grooves 89a and 89b through the rollers 90a and 90b as a result of the relationship between the cam grooves 94a and 94b and the cam grooves 89a and 89b. This rotation of the fine tuning driven member 88 is transmitted by way of the gears 94 and 62 to turn the rotor shaft 59 thereby to accomplish fine tuning.

A feature of the above described mechanism is that, as the fine tuning driving disk 75 rotates, the rollers 90a and 90b undergo displacement without play in the slots 68a and 68b of the detent plate 66 since their flanges 91 are clamped between the detent plate 66 and the fine tuning driven member 88. Therefore, the fine tuning driven member 88 rotates with a rotational angle which is accurately interrelated to the rotational angle which is accurately interrelated to the rotational angle of the fine tuning driving disk 75.

At a specific position on the conical or beveled surface 75a of the fine tuning driving disk 75, a groove 79 may be provided as shown in FIG. 13A. In this case, pressing members 110a and 110b as shown in FIG. 13B are used instead of the pressing members 80a and 80b illustrated in FIG. 11. The pressing member 110a has an inclined surface for contacting flushly against the surface of the conical serrated part 78 of the disk 75 and is forced by the spring 81 into frictional contact with this serrated part 78. The pressing member 110b has an inclined surface for contacting flushly against the conical surface 75a of the disk 75 and, moreover, has a ridge 111 adapted to engage with the above mentioned groove 79 in the conical surface of the disk 75.

The groove 79 is formed in the conical surface 75a at a position such that the ridge 111 engages the groove 79 when the fine tuning driving disk 75 arrives at the midpoint of its rotational range at the time the disk 75 is rotated together with the rotation of the fine tuning shaft 73. In this case, therefore, when the fine tuning shaft 73 is turned, a light arresting force due to the engagement of the ridge 111 and the groove 79 is felt at the midpoint position of the rotational range of the fine tuning shaft 73, whereby the midpoint position can be readily determined.

The device of the above described essential parts and organization thereof is further provided with the following parts lending further refinement to the device.

Referring to FIG. 14, which is an enlarged, exploded perspective view of the stop mechanism 65 and the first bearing plate 52, the first rotating element 65a of this stop mechanism 65 has a bent engagement lug 121 and a rigidly secured cylindrical boss 120 adapted to fit onto the inner end 63a of the coarse tuning shaft 63 and to rotate unitarily therewith. The second rotating element 65b has a bent engagement lug 122 and an engagement lug 123 for engagement with the bent engagement lug 121 of the first rotating element 65a. The third rotating element 65c has an engagement lug 124 and a bent engagement lug 125 for engagement with the lug 122 of the second rotating element 65b. The fourth rotating element 65d has an engagement lug 126 and a bent engagement lug 127 for engagement with the lug 124 of the third rotating element 65c. In assembled state, the second, third, and fourth rotating elements 65b, 65c, and 65d are rotatably fitted on and around the cylindrical boss 120 of the first rotating element 65a. The bearing plate 52 is provided on its inner face with an engagement lug 128 to be engaged by the lug 126 of the fourth rotating element 65d. Furthermore, the fourth rotating element 65d has a small cylindrical boss 129 integrally formed therewith for fitting into a recess 130 in the inner face of the bearing plate 52. The coarse tuning shaft 63 is passed through a hole 131 formed in the bearing plate 52 coaxially with the recess 130.

When the coarse tuning shaft 63 is turned in one direction, only the first rotating element 65a first rotates unitarily therewith. Then, when this first rotating element 65a rotates thus through a specific predetermined angle, its lug 121 engages one end of the lug 123, and thereafter the second rotating element 65b is rotated together with the first rotating element 65a. When the second rotating element 65b rotates through a specific angle, its lug 122 engages one end of the lug 125 of the third rotating element 65c, and thereafter this third rotating element 65c rotates together with the first and second rotating elements 65a and 65b. When the rotating element 65c rotates through as specific angle, its lug 124 engages one end of the lug 127 of the fourth rotating element 65d, and thereafter this fourth rotating element 65d rotates together with the rotating elements 65a, 65b, and 65c. When the fourth rotating element 65d rotates through a specific angle, its lug 126 engages one end of the lug 128 of the fixed bearing plate 52, whereby the rotating of all rotating elements 65a through 65d is stopped.

When the coarse tuning shaft 63 is turned in the direction opposite to the aforementioned one direction, the above described engaging lugs respectively and successively engage the other ends of the engagement lugs, and the coarse tuning shaft 63 can be turned until the rotation of all rotating elements 65a through 65d is stopped.

Thus, the coarse tuning shaft 63 can be turned through a rotational range of more than one revolution (slightly less than three revolutions in the case of the instant embodiment), and, moreover, this rotation can be limited and stopped accurately and positively at the end of this rotational range.

The rotor shaft 59 and the parts of the bearing mechanism of the coarse tuning shaft 63 are shown in the exploded perspective view of FIG. 15. In assembling this bearing mechanism, the bearing plate 52 is fixedly secured to the case 51 with screws 53 with the bearing ring 61b pressed and fitted into the hole 60 in the bearing plate 52. Next, the rotor shaft 59 is inserted through the bearing ring 61b, and then the steel balls 61a are inserted into the space between a small-diameter part 59a of the rotor shaft 59 and a tapered part of the ring 61b. The rotor shaft 59 is thus rotatably journaled on and by the bearing plate 52.

Next, with one part 63b of the coarse tuning shaft 63 rotatably fitted in a hole 140 formed in the auxiliary bearing plate 54, the coarse tuning shaft 63 is inserted through to a position where an annularly grooved part 63c thereof is positioned within the aforementioned hole 131 in the bearing plate 52. Thereafter, the coarse tuning shaft 63 is pushed downward, as viewed in FIG. 15, together with the auxiliary bearing plate 54, and the annularly grooved part 63c is fitted into a V-shaped notch 131a formed contiguously as a part of the hole 131. With the above named parts in this state, the auxiliary bearing plate 54 is fixedly secured with screws 56 to the bearing plate 52. Then, since the grooved part 63c is fitted in the V-shaped notch 131a, the coarse tuning shaft 63 is prevented from being displaced in its axial direction and is prevented from being dislodged from the bearing plate 52.

With the mechanism in this state, the axis of the rotor shaft 59 and the center of the hole 50 are coincident, and, moreover, the axis of the coarse tuning shaft 63 intersects a straight line passing through the valley of the V-shaped notch 131a and the center of the circular hole part of the hole 131 (an extension of this straight line passing through the center of the hole 60). Accordingly, the rotor shaft 59 and the coarse tuning shaft 63 are respectively rotatably supported by the bearing plate 52 with their centerlines in parallel state. Thus, the gear 94 of the fine tuning driven member 88 fitted on the coarse tuning shaft 63 and the gear 62 fixed to the rotor shaft 59 are accurately meshed.

Furthermore, the coarse tuning shaft 63 is rotatably supported directly by the first bearing plate 52 and indirectly by the second bearing plate 64. Since the coarse tuning shaft 63 is rotatably journaled at two points in this manner, it rotates stably, and there is no possiblity of lagging or deviation of the relative positions of this coarse tuning shaft 63 and the fine tuning shaft 73. Accordingly, this features further enhances the resettability.

Further, this invention is not limited to these embodiments but various variations and modifications may be made without departing from the scope and spirit of the invention.

What is claimed is:

1. A UHF tuner device comprising:
    a tuner device proper having a variable capacitor;
    a rotatable coarse tuning shaft for channel selection;
    a first rotatable member which is rotatable unitarily with the coarse tuning shaft, said first rotatable member having an undulating periphery with concave depressions;
    rotational position holding means for holding the first rotatable member in a position to which it has been rotated by the coarse tuning shaft by engaging with any of the concave depressions, said rotational position holding means being organized to allow the rotation of the first rotatable member when the coarse tuning shaft is rotated;
    a rotatable fine tuning shaft provided coaxially with the coarse tuning shaft;
    a second rotatable member disposed on one side of the first rotatable member and adapted to be rotated unitarily with the fine tuning shaft;
    a third rotatable member disposed on the other side of the first rotatable member whereby the first rotatable member is interposed between second and third rotatable members, said first rotatable member having at least one slot, said second rotatable member having at least one first cam groove, said third rotatable member having at least one second cam groove, said second cam groove having a specific angle range smaller than the angle range of the third cam groove;
    means for transmitting the rotation of the third rotatable member to the variable capacitor thereby to vary the capacitance thereof; and
    at least one engaging member passed through the slot of the first rotatable member and displaceably engaged with respectively the first and second cam grooves of the second and third rotatable members, said engaging member displacing in the slot, first cam groove and second cam groove in response to the rotation of the second rotatable member with the fine tuning shaft thereby to transmit the rotation of the second rotatable member to the third rotatable member in a reduced rotation angle, meanwhile the first rotatable member is held its stopped position by the rotational position holding means.

2. A UHF tuner device as claimed in claim 1 in which said engaging member is a ball put between the first and second cam grooves and retained in the slot.

3. A UHF tuner device as claimed in claim 1 in which said engaging member is a roller comprising a cylindrical part passing through the slot and engaging at the ends thereof with the first and second cam grooves and a flange part formed integrally with the cylindrical part and clamped by the first and third rotatable members.

4. A UHF tuner device as claimed in claim 1 which further comprises energizing means for causing the second and third rotatable members respectively to press against the first rotatable member, said second rotatable member having beveled or inclined surface outer periphery, and said energizing means having means for pressing against the beveled outer periphery and imparting a pressing force in a direction such as to press the second rotatable member against the first rotatable member.

5. A UHF tuner device as claimed in claim 4 in which the means for imparting a pressing force comprises a pair of pressing members for pressing against the beveled outer periphery and a spring for imparting a spring force to the pressing members such as to cause the same to clamp and press against the beveled outer periphery.

6. A UHF tuner device as claimed in claim 5 in which one of the pressing members has a projection, and the second rotatable member has in the beveled outer periphery thereof a notch engaged by the projection of said one pressing member at the midpoint rotational position of the rotational range of the second rotatable member rotated by the fine tuning shaft.

7. A UHF tuner device as claimed in claim 5 in which the second rotatable member has in the beveled outer periphery thereof serrations over an expanse thereof corresponding substantially to the rotational range of the second rotatable member, and one of the pressing members has a ridge projection formed thereon for engaging with the serrations.

8. A UHF tuner device as claimed in claim 1 which further comprises an abutting member having a projection and energized to abut continually against the outer peripheral surface of the second rotatable member, and said second rotatable member having a notch formed therein engaged by the projection of abutting member at the midpoint rotational position of the rotational range of the second rotatable member rotated by the fine tuning shaft.

9. A UHF tuner device comprising:
a tuner device proper having a variable capacitor;
a rotatable coarse tuning shaft for channel selection;
a first rotatable member which is rotatable unitarily with the coarse tuning shaft, said first rotatable member having an undulating periphery with concave depressions;
rotational position holding means for holding the first rotatable member in a position to which it has been rotated by the coarse tuning shaft by engaging with any of the concave depressions, said rotational position holding means being organized to allow the rotation of the first rotatable member when the coarse tuning shaft is rotated;
a rotatable fine tuning shaft provided coaxially with the coarse tuning shaft;
a second rotatable member disposed on one side of the first rotatable member and adapted to be rotated unitarily with the fine tuning shaft;
a third rotatable member disposed on the other side of the first rotatable member whereby the first rotatable member in interposed between second and third rotatable members, said first rotatable member having a pair of slots respectively formed in radial directions thereof, said second rotatable member having a pair of first cam grooves respectively having first specific angle ranges with respect to the center thereof, said third rotatable member having a pair of second cam grooves respectively having second specific angle ranges smaller than the first specific angle ranges;
means for transmitting the rotation of the third rotatable member to the variable capacitor thereby to vary the capacitance thereof; and
a pair of engaging members respectively passed through the slots of the first rotatable member and displaceably engaged with respectively the first and second cam grooves of the second and third rotatable members,
said engaging members respectively displacing in the slots, first cam grooves and second cam grooves in response to the rotation of the second rotatable member with the fine tuning shaft thereby to transmit the rotation of the second rotatable member to the third rotatable member in a reduced rotation angle, meanwhile the first rotatable member is held its stopped position by the rotational position holding means.

10. A UHF tuner device comprising:
a tuner device proper having a variable capacitor;
a rotatable coarse tuning shaft for channel selection;
a first rotatable member for rotating unitarily with the coarse tuning shaft;
a rotatable fine tuning shaft provided coaxially with the coarse tuning shaft;
a second rotatable member disposed on one side of the first rotatable member and adapted to rotate unitarily with the fine tuning shaft;
a third rotatable member disposed on the other side of the first rotatable member;
means operated by rotation of the third rotatable member to vary the capacitance of the variable capacitor;
means operating in accordance with rotation of the second rotatable member to cause the third rotatable member to rotate independently of the first rotatable member within a specific angle range which is smaller than the rotation angle range of the second rotatable member; and
energizing means for causing the second and third rotatable members respectively to press against the first rotatable member,
said second rotatable member having a beveled or inclined surface outer periphery, and said energizing means having means for pressing against the beveled outer periphery and imparting a pressing force in a direction such as to press the second rotatable member against the first rotatable member.

11. A UHF tuner device as claimed in claim 10 in which the means for imparting a pressing force comprises a pair of pressing members for pressing against the beveled outer periphery and a spring for imparting a spring force to the pressing members such as to cause the same to clamp and press against the beveled outer periphery.

12. A UHF tuner device as claimed in claim 11 in which one of the pressing members has a projection, and the second rotatable member has in the beveled outer periphery thereof a notch engaged by the projection of said one pressing member at the midpoint rotational position of the rotational range of the second rotatable member rotated by the fine tuning shaft.

13. A UHF tuner device as claimed in claim 11 in which the second rotatable member has in the beveled outer periphery thereof serrations over an expanse thereof corresponding substantially to the rotational range of the second rotatable member, and one of the pressing members has a ridge projection formed thereon for engaging with the serrations.

14. A UHF tuner device comprising:
- a tuner device proper having a variable capacitor;
- a rotatable coarse tuning shaft for channel selection;
- a first rotatable member for rotating unitarily with the coarse tuning shaft;
- a rotatable fine tuning shaft provided coaxially with the coarse tuning shaft;
- a second rotatable member disposed on one side of the first rotatable member and adapted to rotate unitarily with the fine tuning shaft;
- a third rotatable member disposed on the other side of the first rotatable member;
- means operated by rotation of the third rotatable member to vary the capacitance of the variable capacitor; and
- means operating in accordance with rotation of the second rotatable member to cause the third rotatable member to rotate independently of the first rotatable member within a specific angle range which is smaller than the rotation angle range of the second rotatable member; and
- an abutting member having a projection and energized to abut continually against the outer peripheral surface of the second rotatable member;
- said second rotatable member having a notch formed therein engaged by the projection of the abutting member at the midpoint rotational position of the rotational range of the second rotatable member rotated by the fine tuning shaft.

* * * * *